US005777533A

United States Patent [19]

Kato et al.

[11] Patent Number: 5,777,533

[45] Date of Patent: Jul. 7, 1998

[54] LC FILTER WITH EXTERNAL ELECTRODES ONLY ON A SMALLER LAYER

[75] Inventors: Noboru Kato, Sabae; Kouji Nosaka; Atsushi Tojyo, both of Fukui, all of Japan

[73] Assignee: Murata Manufacturing Co., Ltd., Nagaokakyo, Japan

[21] Appl. No.: 648,401

[22] Filed: May 15, 1996

[30] Foreign Application Priority Data

May 16, 1995 [JP] Japan .................................... 7-142620

[51] Int. Cl.[6] .................................................. H03H 7/01

[52] U.S. Cl. ........................................ 333/185; 333/175

[58] Field of Search ..................................... 333/167, 184, 333/185, 175

[56] References Cited

U.S. PATENT DOCUMENTS

| | | | |
|---|---|---|---|
| 5,029,043 | 7/1991 | Kitahara et al. | 333/185 X |
| 5,140,497 | 8/1992 | Kato et al. | 333/202 X |
| 5,251,108 | 10/1993 | Doshita | 336/200 X |
| 5,300,903 | 4/1994 | Okamura et al. | 333/204 |
| 5,387,888 | 2/1995 | Eda et al. | 333/247 |
| 5,404,118 | 4/1995 | Okamura et al. | 333/175 |
| 5,572,175 | 11/1996 | Tada et al. | 333/206 |

FOREIGN PATENT DOCUMENTS

| | | | |
|---|---|---|---|
| 0 435 230 A2 | 7/1991 | European Pat. Off. . | |
| 0 638 953 A1 | 2/1995 | European Pat. Off. . | |
| 4-6911 | 1/1992 | Japan | 333/185 |
| 5-82344 | 4/1993 | Japan | 333/185 |
| 5-136644 | 6/1993 | Japan | 333/167 |
| 5-335866 | 12/1993 | Japan | 333/185 |
| 2 282 270 | 3/1995 | United Kingdom . | |
| WO 93/19527 | 9/1993 | WIPO . | |

*Primary Examiner*—Robert Pascal
*Assistant Examiner*—Justin P. Bettendorf
*Attorney, Agent, or Firm*—Burns, Doane, Swecker & Mathis, LLP

[57] ABSTRACT

There is provided an LC filter in which the leakage of an electromagnetic field to the outside is suppressed. The LC filter 20 includes a laminated element 22. The laminated element 22 includes a multiplicity of dielectric layers **24*a*–24*h*. One end of a pattern electrode 34*a* serving as an inductor of an LC resonator is connected to a capacitor electrode 30*a* serving as a part of a capacitor of an LC resonator through a via hole formed in the dielectric layers 24*d* and 24*e*. The other end of the pattern electrode 34*a* is connected to one end of a pattern electrode 36*a* through a via hole formed in the dielectric layer 24*f*. The other end of the pattern electrode 36*a* is connected to a ground electrode 32*a* through a via hole formed in the dielectric layers 24*e* and 24*f*. Similarly, one end of a pattern electrode 34*b* serving as an inductor of another LC resonator is connected to a capacitor electrode 30*b* serving as a part of a capacitor of an LC resonator through a via hole formed in the dielectric layers 24*d* and 24*e*. The other end of the pattern electrode 34*b* is connected to one end of a pattern electrode 36*b* through a via hole formed in the dielectric layer 24*f*. The other end of the pattern electrode 36*b* is connected to a ground electrode 32*b* through a via hole formed in the dielectric layers 24*e* and 24*f***.

10 Claims, 8 Drawing Sheets

LC FILTER WITH EXTERNAL ELECTRODES ONLY ON A SMALLER LAYER

BACKGROUND OF THE INVENTION

1. Field of the Invention

The present invention relates to LC filters and, more particularly, to an LC filter having pattern electrodes serving as inductors which is used in a portable radio device or the like.

2. Description of the Related Art

FIG. 9 is a perspective view of an example of a conventional LC filter. FIG. 10 is a sectional view of the LC filter shown in FIG. 9. FIG. 11 is an exploded perspective view of major parts of the LC filter shown in FIG. 9. FIG. 12 is an equivalent circuit diagram shown in FIG. 9. The LC filter 1 shown in FIGS. 9 through 12 includes a multi-layer substrate or laminated element 2. As shown in FIGS. 10 and 11, the laminated element 2 is formed by laminating a multiplicity of dielectric layers 3*a*–3*h* constituted by a multiplicity of ceramic layers, or the like.

Two ground electrodes 4*a* and 4*b* are formed on the bottom dielectric layer 3*a*. Two capacitor electrodes 5*a* and 5*b* are formed on the dielectric layer 3*b* which is second from the bottom. Two capacitor electrodes 6*a* and 6*b* are formed on the dielectric layer 3*c* which is third from the bottom. Two ground electrodes 7*a* and 7*b* are formed on the dielectric layer 3*d* which is fourth from the bottom. Two pattern electrodes 8*a* and 8*b* are formed on the dielectric layer 3*e* which is fifth from the bottom. Two pattern electrodes 9*a* and 9*b* are formed on the dielectric layer 3*f* which is sixth from the bottom. Two ground electrodes 10*a* and 10*b* are formed on the dielectric layer 3*g* which is the seventh layer from the bottom.

As shown in FIG. 9, ten external electrodes 11*a*–11*j* are formed on the side, upper and bottom surfaces of this laminated element 2. The external electrode 11*a* is connected to the ground electrodes 4*a*, 7*a* and 10*a* and one end of the pattern electrode 8*a*. The external electrode 11*b* is connected to the ground electrodes 4*a*, 7*a*, and 10*a*. The external electrode 11*c* is connected to the capacitor electrode 6*b* and one end of the pattern electrode 9*b*. The external electrode 11*d* is connected to the capacitor electrode 5*b*, one end of the pattern electrode 8*b*, and the other end of the pattern electrode 9*b*. The external electrode 11*e* is connected to the ground electrodes 4*b*, 7*b*, and 10*b*. The external electrode 11*f* is connected to the ground electrodes 4*b*, 7*b*, and 10*b* and the other end of the pattern electrode 8*b*. The external electrode 11*g* is connected to the ground electrodes 4*b*, 7*b*, and 10*b*. The external electrode 11*h* is connected to the capacitor electrode 6*a* and one end of the pattern electrode 9*a*. The external electrode 11*i* is connected to the capacitor electrode 5*a*, the other end of the pattern electrode 8*a*, and the other end of the pattern electrode 9*a*. The external electrode 11*j* is connected to the ground electrodes 4*a*, 7*a*, and 10*a*.

In this LC filter 1, each of the pattern electrodes 8*a*, 8*b*, 9*a*, and 9*b* serves as an inductor of an LC resonator. Further, a capacitor of an LC resonator is formed between the ground electrode 4*a* and the capacitor electrode 5*a*, and a capacitor of an LC resonator is also formed between the ground electrode 4*b* and the capacitor electrode 5*b*. In addition, a capacitor of an LC resonator is also formed between the capacitor electrodes 5*a* and 6*a*, and a capacitor of an LC resonator is also formed between the capacitor electrodes 5*b* and 6*b*. A capacitor is formed between the capacitor electrodes 6*a* and 6*b*. Further, a capacitor is formed between the capacitor electrode 6*a* and the ground electrode 7*a*. Moreover, a capacitor is formed between the capacitor electrode 6*b* and the ground electrode 7*b*. Each of the external electrodes 11*a*, 11*b*, 11*e*, 11*f*, 11*g*, and 11*j* is used as a ground terminal, and each of the external electrodes 11*d* and 11*i* is used as an input/output terminal. Therefore, this LC filter 1 has an equivalent circuit as shown in FIG. 12.

In this LC filter 1, stray capacitance is generated between the external electrodes and the electrodes inside the laminated element. Therefore, it has a circuit configuration designed taking the stray capacitance into consideration.

However, since the pattern electrodes of the LC filter 1 serving as inductors are connected to other electrodes through the external electrodes, an electromagnetic field leaks out from the laminated element through the external electrodes. As a result, the characteristics of this filter can become unstable depending on the environment such as other components surrounding it.

Further, since the inductors and capacitors of this LC filter 1 are connected by the external electrodes, the LC filter 1 is not only severely adversely affected by external noises but also is likely to produce radiant noises.

Further, in this LC filter 1, the size of the surface of the laminated element is determined by the number of the external electrodes required. The large number of external electrodes having large surface areas make this filter large and expensive.

In addition, since the external electrodes of this LC filter 1 extend between the upper and lower surfaces of the laminated element covering the sides of the laminated element, a large amount of stray capacitance is generated between the external electrodes and the electrodes inside the laminated element. This can produce a great insertion loss, eliminate steepness of attenuation characteristics indicating attenuation relative to frequencies, and result in deterioration of characteristics such as a decrease in attenuation.

SUMMARY OF THE INVENTION

It is therefore a primary object of the present invention to provide an LC filter in which the leakage of an electromagnetic field to the outside is suppressed.

According to the present invention, there is provided an LC filter incorporating pattern electrodes serving as inductors characterized in that the number of external electrodes is reduced by connecting the ends of the pattern electrodes to other electrodes through via holes formed in ceramic layers.

The reduction of the external electrodes in an LC filter according to the present invention may be achieved by reducing the area of the external electrodes.

The leakage of an electromagnetic field is suppressed because the ends of the pattern electrodes serving as inductors are connected to other electrodes through via holes formed in the ceramic layers.

The present invention provides an LC filter in which the leakage of an electromagnetic field to the outside is suppressed.

The above and other object, features and advantages of the present invention will be more clearly understood from the following detailed description of embodiments thereof which will proceed with reference to the drawings.

DETAILED DESCRIPTION OF THE PREFERRED EMBODIMENTS

Figure 1:
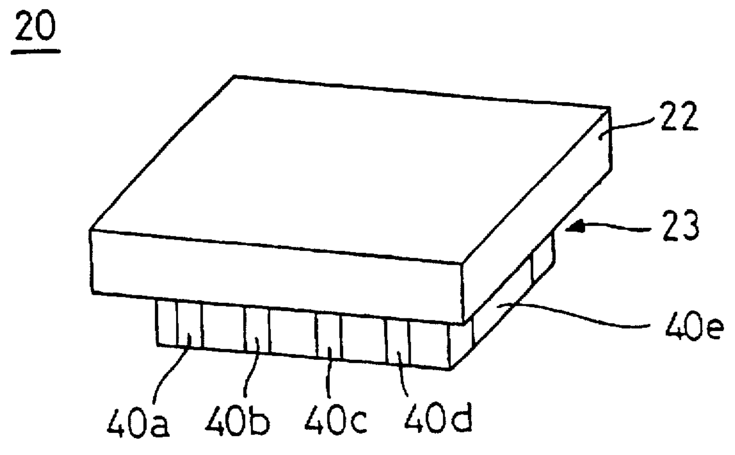
FIG. 1 is a perspective view of an embodiment of the present invention.
Figure 2:
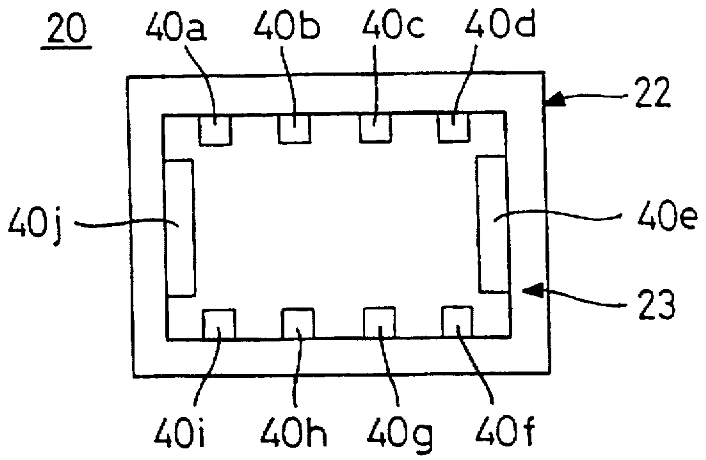
FIG. 2 is a bottom view of the embodiment shown in FIG. 1.
Figure 3:
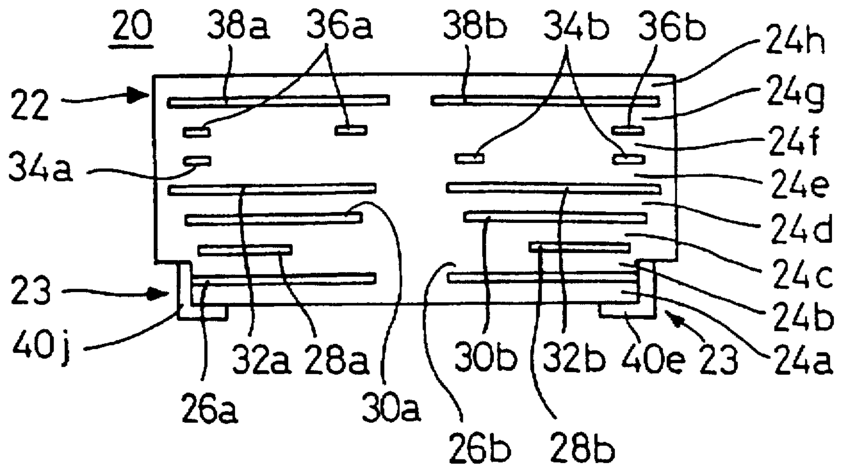
FIG. 3 is a sectional view of the embodiment shown in FIG. 1.
Figure 4:
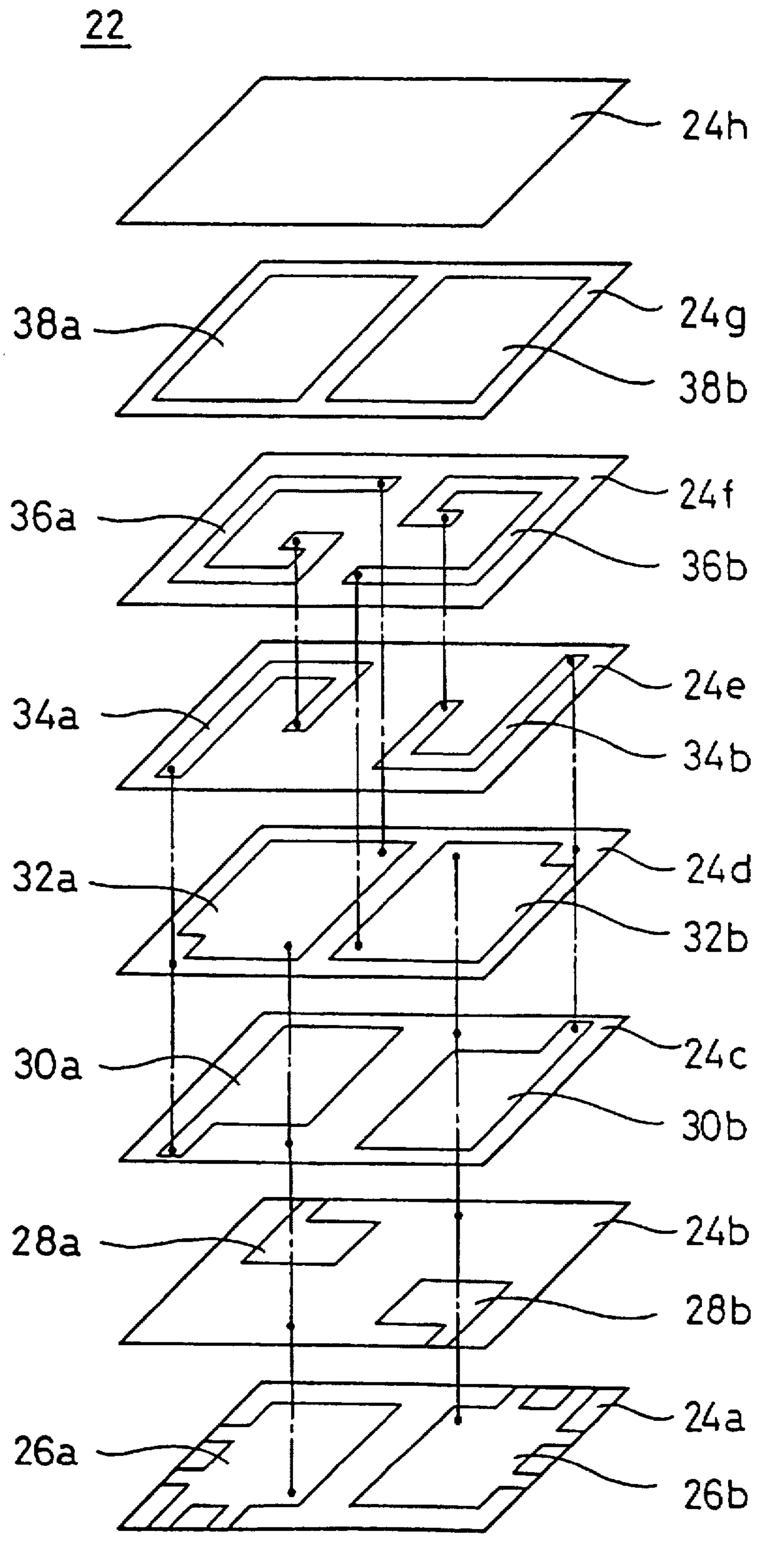
FIG. 4 is an exploded perspective view of major parts of the embodiment shown in FIG. 1.
Figure 5:
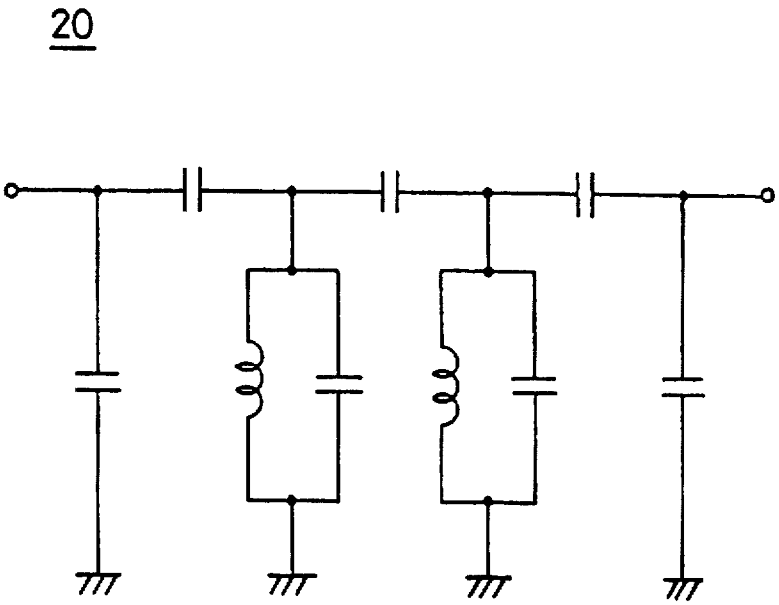
FIG. 5 is an equivalent circuit diagram of the embodiment shown in FIG. 1.

FIG. 1 is a perspective view of an embodiment of the present invention. FIG. 2 is a bottom view of the embodiment shown in FIG. 1. FIG. 3 is a sectional view of the embodiment shown in FIG. 1. FIG. 4 is an exploded perspective view of major parts of the embodiment shown in FIG. 1. FIG. 5 is an equivalent circuit diagram of the embodiment shown in FIG. 1. An LC filter 20 which is the embodiment shown in FIGS. 1 though 5 includes a multilayer substrate or laminated element 22. A step portion 23 is formed around the lower part of the laminated element 22. As shown in FIGS. 3 and 4, the laminated element 22 is formed by laminating, for example, a multiplicity of dielectric layers **24*a*–24*h* constituted by a multiplicity of ceramic layers. In order to form the step portion 23 at the lower part of the laminated element 22, the bottom dielectric layer 24*a* and the lower part of the dielectric layer 24*b* which is the second layer from the bottom are formed in a size smaller than that of the remaining dielectric layers 24*c*–24*h***.

Two ground electrodes **26*a* and 26*b* are formed on the bottom dielectric layer 24*a*. Two capacitor electrodes 28*a* and 28*b* are formed on the dielectric layer 24*b* which is second from the bottom. The capacitor electrodes 28*a* and 28*b* form a capacitor for adjusting the impedance of the input/output. Two capacitor electrodes 30*a* and 30*b* are formed on the dielectric layer 24*c* which is third from the bottom. Two ground electrodes 32*a* and 32*b* are formed on the dielectric layer 24*d* which is fourth from the bottom. Two pattern electrodes 34*a* and 34*b* are formed on the dielectric layer 24*e* which is fifth from the bottom. Two pattern electrodes 36*a* and 36*b* are formed on the dielectric layer 24*f* which is sixth from the bottom. Two shield electrodes 38*a* and 38*b* are formed on the dielectric layer 24*g*** which is seventh from the bottom.

One end of the pattern electrode **34*a* is connected to the capacitor electrode 30*a* through a via hole formed in the dielectric layers 24*d* and 24*e*. The other end of the pattern electrode 34*a* is connected to one end of the pattern electrode 36*a* through a via hole formed in the dielectric layer 24*f*. The other end of the pattern electrode 36*a* is connected to the ground electrode 32*a* through a via hole formed in the dielectric layers 24*e* and 24*f*. Similarly, one end of the pattern electrode 34*b* is connected to the capacitor electrode 30*b* through a via hole formed in the dielectric layers 24*d* and 24*e*. The other end of the pattern electrode 34*b* is connected to one end the pattern electrode 36*b* through a via hole formed in the dielectric layer 24*f*. The other end of the pattern electrode 36*b* is connected to ground electrode 32*b* through a via hole formed in the dielectric layers 24*e* and 24*f*. The ground electrode 32*a* is connected to the ground electrode 26*a* through a via hole formed in the dielectric layers 24*b*–24*d*. Similarly, the ground electrode 32*b* is connected to the ground electrode 26*b* through a via hole formed in the dielectric layers 24*b*–24*d***.

As shown in FIGS. 1 and 2, ten external electrodes **40*a*–40*j* are formed on the side and bottom surfaces which define the step portion 23 of this laminated element 22. Here, the external electrodes 40*a*, 40*b*, and 40*j* are connected to the ground electrode 26*a*. The external electrodes 40*e*, 40*f*, and 40*g* are connected to the ground electrode 26*b*. The external electrode 40*d* is connected to the capacitor electrode 28*b*. The external electrode 40*i* is connected to the capacitor electrode 28*a*. The external electrodes 40*c* and 40*h* are not connected to any electrode inside the laminated element 22**.

In this LC filter 20, the pattern electrodes **34*a* and 36*a* serve as an inductor of an LC resonator, and the pattern electrodes 34*b* and 36*b* serve as an inductor of another LC resonator. A capacitor is formed between the ground electrode 26*a* and the capacitor electrode 28*a*, and a capacitor is formed between the ground electrode 26*b* and the capacitor electrode 28*b*. Further, a capacitor is formed between the capacitor electrodes 28*a* and 30*a*, and a capacitor is formed between the capacitor electrodes 28*b* and 30*b*. Further, a capacitor is formed between the capacitor electrodes 30*a* and 30*b*. Furthermore, a capacitor of an LC resonator is formed between the capacitor electrode 30*a* and the ground electrode 32*a*. Similarly, a capacitor of another LC resonator is formed between the capacitor electrode 30*b* and the ground electrode 32*b*. Each of the external electrodes 40*a*, 40*b*, 40*e*, 40*f*, 40*g*, and 40*j* is used as a ground terminal, and each of the external electrodes 40*d* and 40*i* is used as an input/output terminal. Therefore, this LC filter 20 has an equivalent circuit as shown in FIG. 5**.

For example, this LC filter 20 is manufactured as follows. A plurality of ceramic green sheets are prepared which will serve as the ceramic layers. Via holes are formed in predetermined ceramic green sheets and are filled with conductive paste. Conductive paste is printed on predetermined ceramic green sheets to form each electrode. Then, those ceramic sheets are dried, laminated, and contact-bonded. The resultant contact-bonded ceramic sheet is diced in a lower part thereof to form the step portion, burned, and then cut into individual laminated elements. Then, the external electrodes are formed on the individual laminated elements, and this completes the manufacture of individual LC filters 20. The LC filter 20 may be manufactured using other methods.

Figure 9:
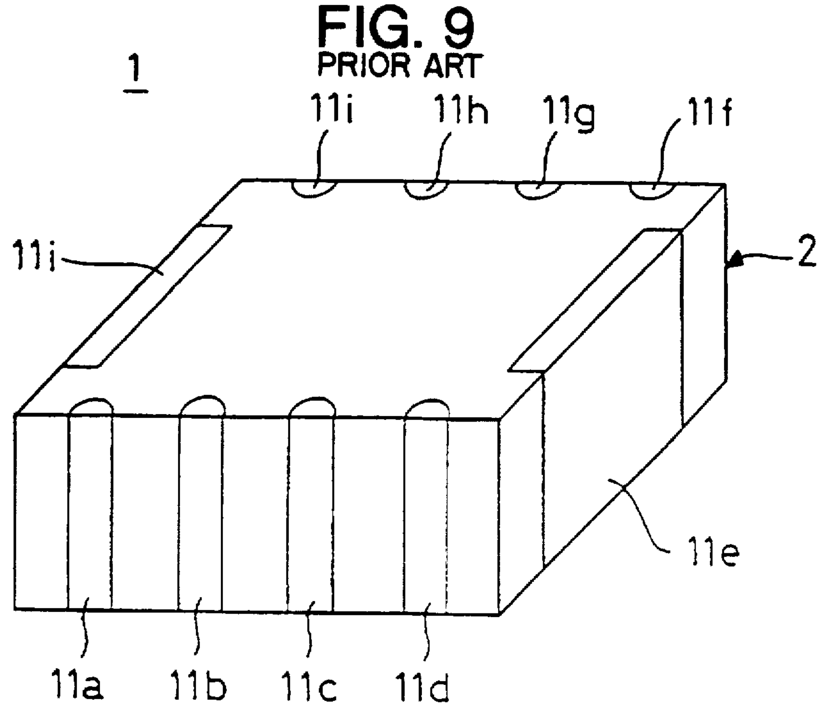
FIG. 9 PRIOR ART
FIG. 9 is a perspective view of an example of a conventional LC filter.
Figure 10:
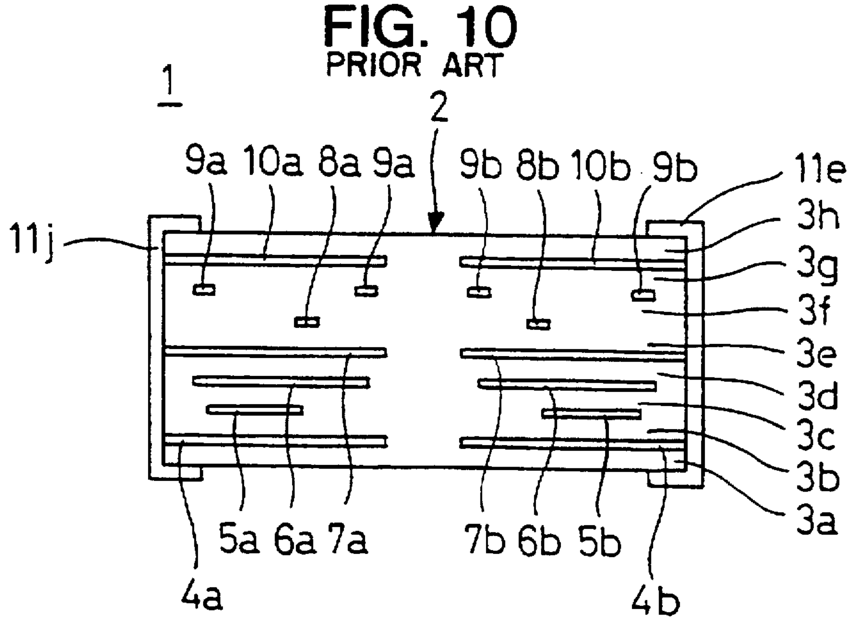
FIG. 10 PRIOR ART
FIG. 10 is a sectional view of the LC filter shown in FIG. 9.
Figure 11:
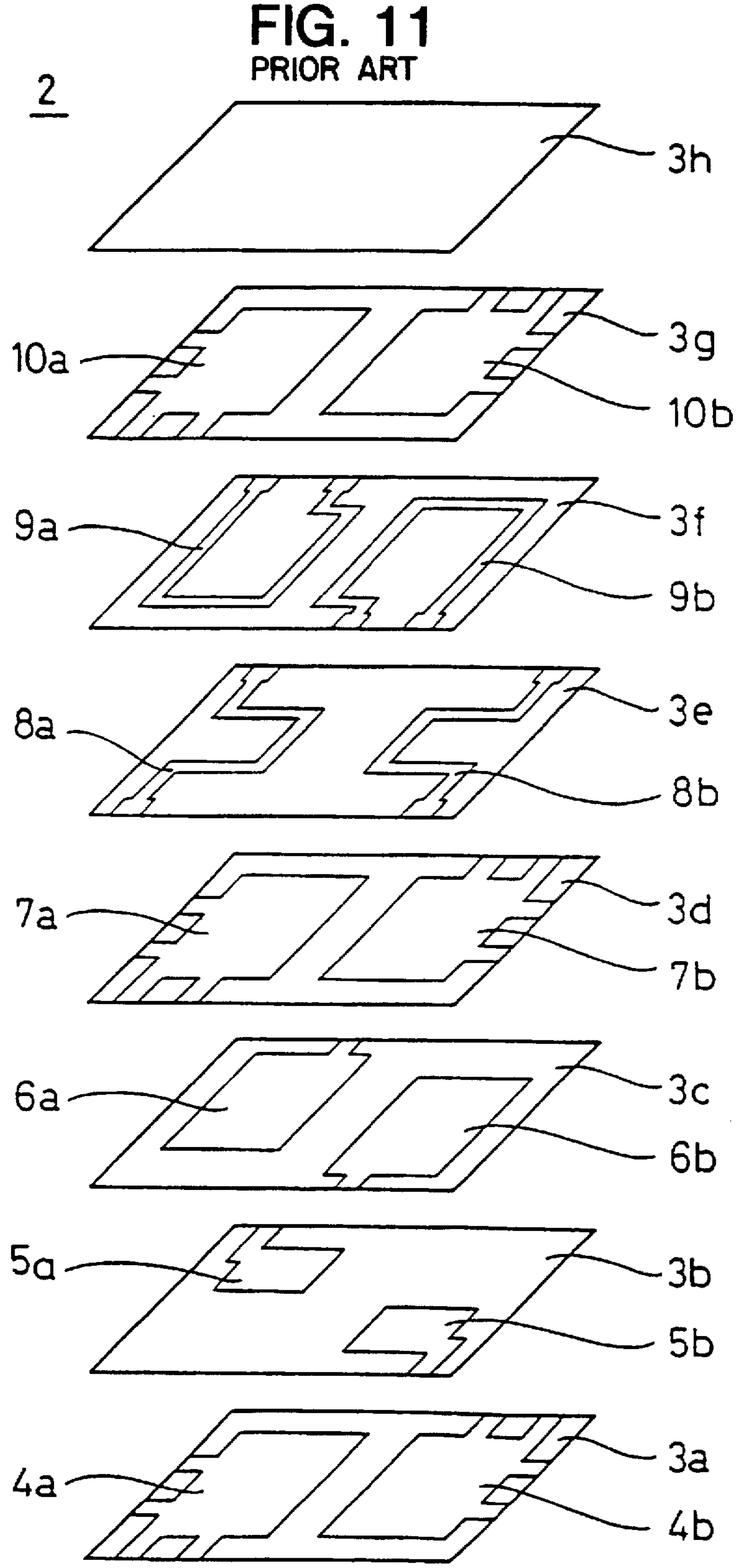
FIG. 11 PRIOR ART
FIG. 11 is an exploded perspective view of major parts of the LC filter shown in FIG. 9.
Figure 12:
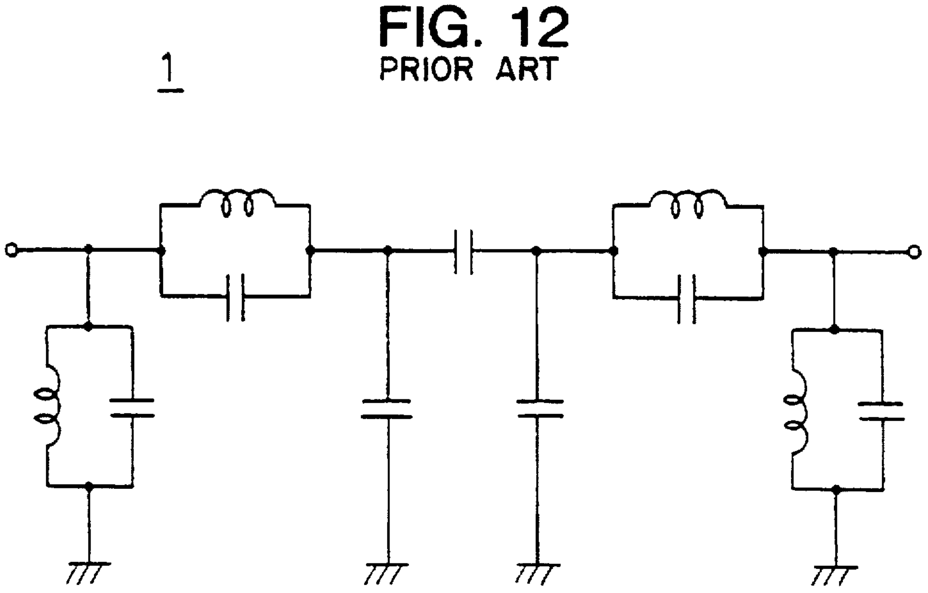
FIG. 12 PRIOR ART
FIG. 12 is an equivalent circuit diagram of the LC filter shown in FIG. 9.

In this LC filter 20, the ends of the pattern electrodes serving as inductors of LC resonators are connected to other electrodes through the via holes formed in the ceramic layers. As a result, when compared to the LC filter shown in FIG. 9, this filter has less leakage of an electromagnetic field from the laminated element, and the characteristics of this filter are less likely to become unstable depending on the environment such as other components surrounding it.

Further, in the LC filter 20 wherein the pattern electrodes serving as inductors of LC resonators and the capacitor electrodes serving as part of capacitors of LC resonators are connected through the via holes formed in the ceramic layers, no external electrode is connected to the electrodes inside the laminated element 22 other than the external electrodes used as ground terminals and input/output terminals. As a result, compared to the LC filter 1 shown in FIG. 9, this filter is more resistant to external noises and is improved with respect to radiant noises by 20 dBm or more, i.e., produces less radiant noises.

Further, in the LC filter 20, a step portion is formed at the lower part of the laminated element, and the external electrodes are not formed on the upper part of the sides and the upper surface of the laminated element but are formed only on the lower part of the sides and the bottom surface of the laminated element. Therefore, the area of the external electrodes of this filter is smaller than that of the LC filter 1 shown in FIG. 9, which reduces the overall size and cost of this filter.

Moreover, in the LC filter 20 wherein the external electrodes are not formed on the upper part of the sides and the upper surface of the laminated element but are formed only on the lower part of the sides and the bottom surface of the laminated element, the stray capacitance produced between the external electrodes and the electrodes inside the laminated element is small. As a result, when compared to the LC filter 1 shown in FIG. 9, this filter has smaller insertion loss and has improved characteristics such as steep attenuation characteristics indicating attenuation relative to frequencies and an increased attenuation.

In addition, in, the LC filter 20, the leakage of an electromagnetic field from the laminated element is suppressed because the pattern electrodes serving as inductors of LC resonators are covered by the ground electrodes, capacitor electrodes, and shield electrodes.

Figure 6:
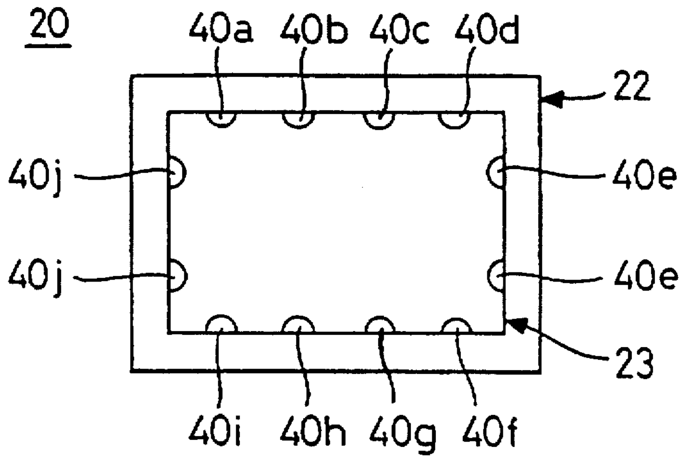
FIG. 6 is a bottom view of a modification of the embodiment shown in FIG. 1.

FIG. 6 is a bottom view of a modification of the embodiment shown in FIG. 1. In the embodiment shown in FIG. 6, unlike the embodiment shown in FIG. 1, the ends of the external electrodes 40*a*–40*d* and 40*f*–40*i* are in the form of semicircular via holes, and each of the external electrodes 40*e* and 40*j* is halved and the ends thereof are also in semicircular forms. The embodiment shown in FIG. 6 has an equivalent circuit and advantages similar to those of the embodiment shown in FIG. 1. Thus, the shape and number of the external electrodes may be arbitrarily changed.

Figure 7:
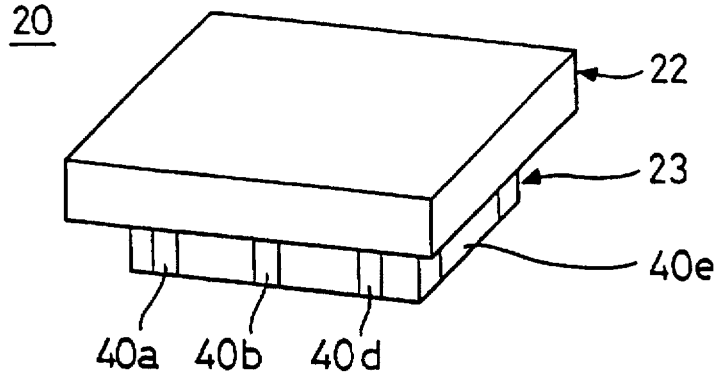
FIG. 7 is a perspective view of another modification of the embodiment shown in FIG. 1.
Figure 8:
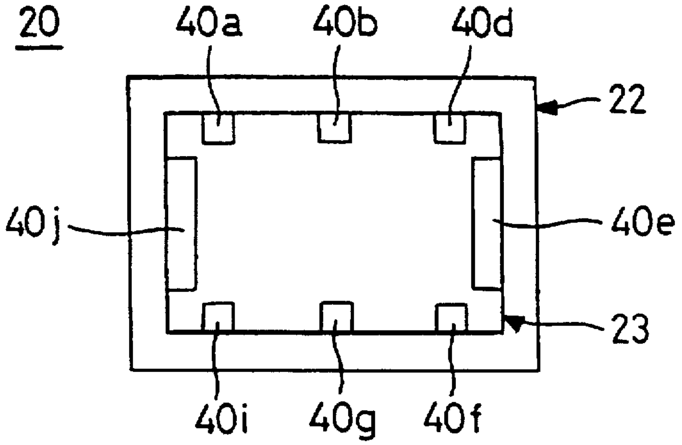
FIG. 8 is a bottom view of the embodiment shown in FIG. 7.

FIG. 7 is a perspective view of another modification of the embodiment shown in FIG. 1. FIG. 8 is a bottom view of the embodiment shown in FIG. 7. Unlike the embodiment shown in FIG. 1, the embodiment shown in FIG. 7 does not include the external electrodes 40*c* and 40*h* which are not connected to the electrodes inside the laminated element. Therefore, the embodiment shown in FIG. 7 also has an equivalent circuit and advantages similar to those of the embodiment shown in FIG. 1. The embodiment shown in FIG. 7 has fewer external electrodes compared to the embodiment shown in FIG. 1. Therefore, it can be made more compact and inexpensive.

Although ceramic layers are used as the dielectric layers in the above-described embodiments, the present invention may be implemented using insulator layers or magnetic material layers in place of the ceramic layers.

Further, according to the present invention, the number and thicknesses of the ceramic green sheets that form the ceramic layers may be arbitrarily changed.

In addition, although the external electrodes are formed on the bottom of the laminated element in the exemplary embodiments, it is not necessary to form the external electrodes on the bottom of the laminated element according to the present invention.

Furthermore, according to the present invention, although the external electrodes may be entirely formed only on the surface of the laminated element, they may be partially embedded in the laminated element.

Figure 13:
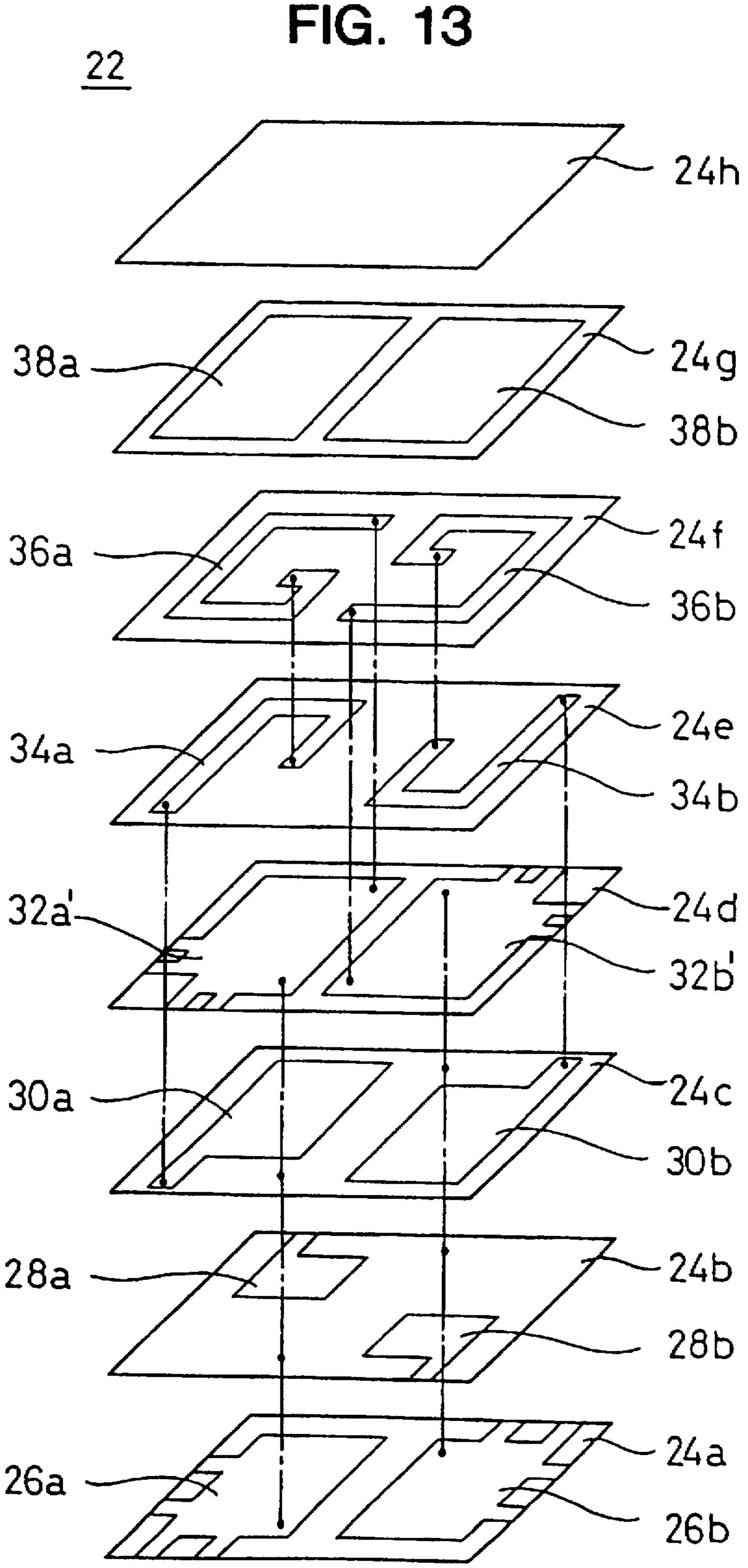
FIG. 13 is an exploded perspective view of major parts of another modification of the embodiment.

As shown in FIG. 13, ground electrodes 32*a*' and 32*b*' may be extended to ends of a dielectric layer 24*d* in order to connect the ground electrodes 32*a*' and 32*b*' to the external electrode.

The step portion 23 can be dispensed with, although the step portion 23 is provided in the embodiments described above.

As shown in FIG. 4, ground electrodes 32*a* and 32*b* are disposed between capacitor electrodes 30*a*, 30*b*, and pattern electrodes 34*a* and 34*b*, thereby an inductor and a capacitor are shielded by a ground electrode. Thus, the mutual interference can be prevented and the design of the resonator can be simplified.

While particular embodiments of the present invention have been shown and described, it will be clear to those skilled in the art that changes and modifications may be made without departing from the invention in its broader aspects and, therefore, the appended claims are to encompass within their scope all such changes and modifications as fall within the true spirit and scope of this invention.

What is claimed is:

1. An LC filter comprising:

a plurality of ceramic layers, wherein one of said plurality of ceramic layers is smaller in outside planar dimensions in its major plane than other ceramic layers;

a plurality of pattern electrodes;

a plurality of via holes formed in the ceramic layers for interconnecting said pattern electrodes; and a plurality of external electrodes, wherein said plurality of electrodes is located only on said ceramic layer which is smaller in planar dimensions.

2. An LC filter comprising:

a plurality of dielectric layers arranged in a stacked relation, wherein one of said plurality of dielectric layers is smaller in outside planar dimensions in its major plane than other dielectric layers;

a plurality of capacitor electrodes located on at least one of said plurality of dielectric layers;

at least one pattern electrode located on at least one of said plurality of dielectric layers;

at least one ground electrode located on at least one of said plurality of dielectric layers, wherein said at least one pattern electrode is interconnected to at least one electrode selected among a group consisting of said at least one ground electrodes and said plurality of capacitor electrodes through a via hole in atleast one of said dielectric layers; and a plurality of external electrodes, wherein said plurality of electrodes is located only on said dielectric layer which is smaller in planar dimensions.

3. An LC filter according to claim 2, wherein said smaller dielectric layer is the bottom layer.

4. An LC filter according to claim 3, wherein said external electrodes are located on at least one side surface of said smaller dielectric layer.

5. An LC filter according to claim 3, wherein said external electrodes are located on at least one side surface and a bottom surface of said smaller dielectric layer.

6. An LC filter comprising:

a laminated element including a multiplicity of dielectric layers, wherein one of said multiplicity of dielectric layers is smaller in outside planar dimensions in its major plane than other dielectric layers;

a pattern electrode located on at least one of said dielectric layers of said laminated element;

a capacitor electrode located on another one of said dielectric layers of said laminated element, wherein said capacitor electrode is connected through via holes to one end of said pattern electrode;

a ground electrode located on yet another one of said dielectric layers of said laminated element, wherein said ground electrode is connected through via holes to the other end of said pattern electrode and disposed between said capacitor electrode and said pattern electrode, being opposite to said capacitor electrode;

another capacitor electrode located on still another one of said dielectric layers of said laminated element;

another ground electrode disposed on an outermost dielectric layer of said laminated element; and a plurality of external electrodes, wherein said plurality of electrodes is located only on said dielectric layer which is smaller in planar dimensions.

7. An LC filter comprising:

a laminated element including a multiplicity of dielectric layers, wherein one of said multiplicity of dielectric layers is smaller in outside planar dimensions in its major plane than other dielectric layers;

a first pattern electrode located on at least one of said dielectric layers of said laminated element;

a first capacitor electrode located on another one of said dielectric layers of said laminated element, wherein said first capacitor is connected to one end of said first pattern electrode;

a first ground electrode located on yet another one of said dielectric layers of said laminated element, wherein said first ground electrode is connected to the other end of said first pattern electrode and disposed opposite to said first capacitor electrode;

wherein said one end of said first pattern electrode is connected to said first capacitor electrode through a via hole, and wherein said first ground electrode is disposed between said first pattern electrode and said first capacitor electrode; and a plurality of external electrodes, wherein said plurality of electrodes is located only on said dielectric layer which is smaller in planar dimensions.

8. An LC filter according to claim 7, further comprising a second capacitor electrode, wherein said second capacitor electrode is disposed opposite to said first capacitor electrode.

9. An LC filter according to claim 8, wherein a first external electrode of said plurality of external electrodes is connected to said second capacitor electrode and is provided on an end surface of said laminated element, and wherein a second external electrode is connected to said second ground electrode and is provided on said end surface of said laminated element.

10. An LC filter according to claim 7, wherein a first external electrode of said plurality of external electrodes is connected to said second capacitor electrode and is provided on an end surface of said laminated element, and wherein a second external electrode is connected to said second ground electrode and is provided on said end surface of said laminated element.

* * * * *